United States Patent [19]
Diaz et al.

[11] Patent Number: 5,404,041
[45] Date of Patent: Apr. 4, 1995

[54] SOURCE CONTACT PLACEMENT FOR EFFICIENT ESD/EOS PROTECTION IN GROUNDED SUBSTRATE MOS INTEGRATED CIRCUIT

[75] Inventors: Carlos H. Diaz, Urbana, Ill.; Charvaka Duvvury, Plano, Tex.; Sung-Mo Kang, Champaign, Ill.

[73] Assignee: Texas Instruments Incorporated, Dallas, Tex.

[21] Appl. No.: 40,957

[22] Filed: Mar. 31, 1993

[51] Int. Cl.$^6$ .................. H01L 27/04; H01L 29/78
[52] U.S. Cl. .................. 257/360; 257/401; 257/758; 257/773; 361/56; 361/91
[58] Field of Search .......... 257/360, 401, 758, 773; 361/56, 91

[56] References Cited

U.S. PATENT DOCUMENTS

| | | | |
|---|---|---|---|
| 4,692,781 | 9/1987 | Rountree et al. | 257/360 |
| 4,952,994 | 8/1990 | Lin | 257/360 |

Primary Examiner—Mark V. Prenty
Attorney, Agent, or Firm—Jacqueline J. Garner; Richard L. Donaldson; William E. Hiller

[57] ABSTRACT

An ESD/EOS protection circuit (100) for protecting an integrated circuit. A MOS transistor (102) is arranged in a multi-finger configuration having a plurality of drain regions (124), a plurality of source regions (122) and a plurality of gates (118). A first metal layer (162) substantially covers each of the drain regions (124) and is in contact with each of the drain regions (124) via drain contacts (130). A second metal layer (154) substantially covers each of the source regions (122) and is in contact with each of the source regions via source contacts (128). A plurality of source contacts (128) are located at a minimum distance from gates (118). Metal-to-metal contacts (160) connect a third metal layer (156) with the second metal layer (154) over each of the source regions (122).

13 Claims, 7 Drawing Sheets

SOURCE CONTACT PLACEMENT FOR EFFICIENT ESD/EOS PROTECTION IN GROUNDED SUBSTRATE MOS INTEGRATED CIRCUIT

FIELD OF THE INVENTION

This invention generally relates to semiconductor device design and more specifically to source contact placement for efficient ESD/EOS protection in grounded substrate MOS integrated circuits.

BACKGROUND OF THE INVENTION

Electrostatic discharge (ESD) and electrical overstress (EOS) are two of the most dominant reliability concerns in the semiconductor industry. The failure susceptibility of integrated circuits (ICs) to ESD and EOS increases as the IC technology progresses towards submicron feature lengths. In spite of the fact that EOS embodies a broad category of electrical threats to semiconductor devices, it is generally accepted that EOS stress sources cause device failure as a result of device self-heating and furthermore, that these sources can be modeled as current sources. This being the case, EOS/EOS immunity of integrated circuits may be qualified in terms of the stress power and/or the stress current required to induce device failure in a specified time.

ESD protection for input, output and/or power supply pins in advanced CMOS ICs is achieved by a protection network that shunts the protected pin and the ground bus under stress events. For input pins, a dedicated protection network that is completely passive under normal operating conditions is added to the input's functional circuitry. For output pins, protection against ESD and EOS is attained with a dedicated protection network whose failure thresholds can in some cases be enhanced by the self-protection capability of the output buffer transistors.

The most common protection schemes used in MOS ICs rely on the parasitic bipolar transistor associated with an nMOS device whose drain is connected to the pin to be protected and whose source is tied to ground. The protection level or failure threshold can be set by varying the nMOS device width. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism found in the nMOS protection device operating in snapback conditions is the onset of second breakdown. Second breakdown is a phenomena that induces thermal runaway in the device wherever the reduction of the impact ionization current is offset by the thermal generation of carriers. Second breakdown is initiated in a device under stress as a result of the self-heating. The peak nMOS device temperature at which second breakdown is initiated is known to increase with the stress current level. The time required for the structure to heat-up to this critical temperature is dependent on the device layout and stress power distribution across the device.

SUMMARY OF THE INVENTION

Generally, and in one form of the invention, an ESD/EOS protection circuit for protecting an integrated circuit is disclosed. A MOS transistor is connected between a pad to be protected and ground. At least one source contact is located in the source region of the MOS transistor at a first distance from the gate of the MOS transistor. At least one drain contact is located in the drain region of the MOS transistor at a second distance from the gate. The source contact to gate spacing (i.e., the first distance) is designed to be smaller than the drain contact to gate spacing (i.e., the second distance) in order to increase the failure threshold of the protection circuit.

In one embodiment of the invention, the MOS transistor is arranged in a multifinger configuration. A plurality of source contacts are located in each of the source regions at a minimum distance from an associated gate. A plurality of drain contacts is located in each of the drain regions. A first metal slab extends over and substantially covers each of the drain regions. The first metal slab is in contact with each of the drain regions via the drain contacts. A second metal slab extends over and substantially covers each of the source regions. The second metal slab is in contact with each of the source regions via the source contacts. A third metal slab extends over and substantially covers the MOS transistor. A plurality of metal-to-metal contacts connects the third metal slab with the second metal slab over each of the source regions.

An advantage of the invention is providing an ESD/EOS protection circuit having uniform stress current distribution.

A further advantage of the invention is providing an ESD/EOS protection circuit capable of handling higher stress currents.

These and other advantages will be apparent to those of ordinary skill in the art having reference to the following specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The preferred embodiment of the invention will be described in connection with a grounded substrate MOS IC. It will be apparent to those skilled in the art that the invention is equally applicable to MOS, CMOS and BiCMOS processes.

Figure 1:
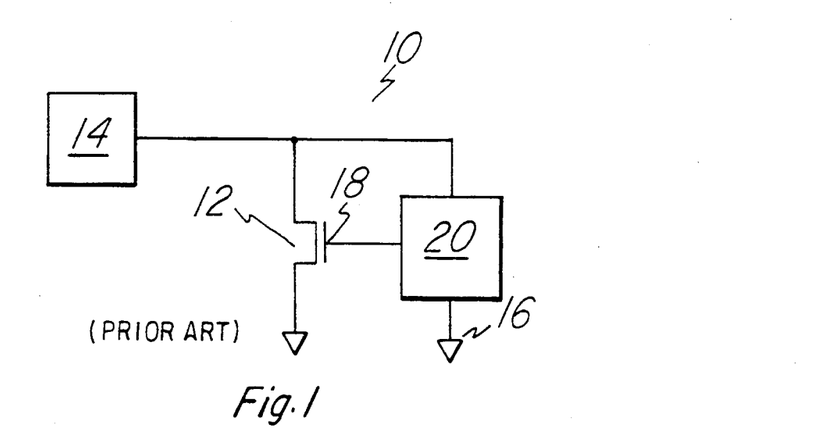
FIG. 1 is a schematic diagram of a prior art ESD/EOS protection circuit.
Figure 2:
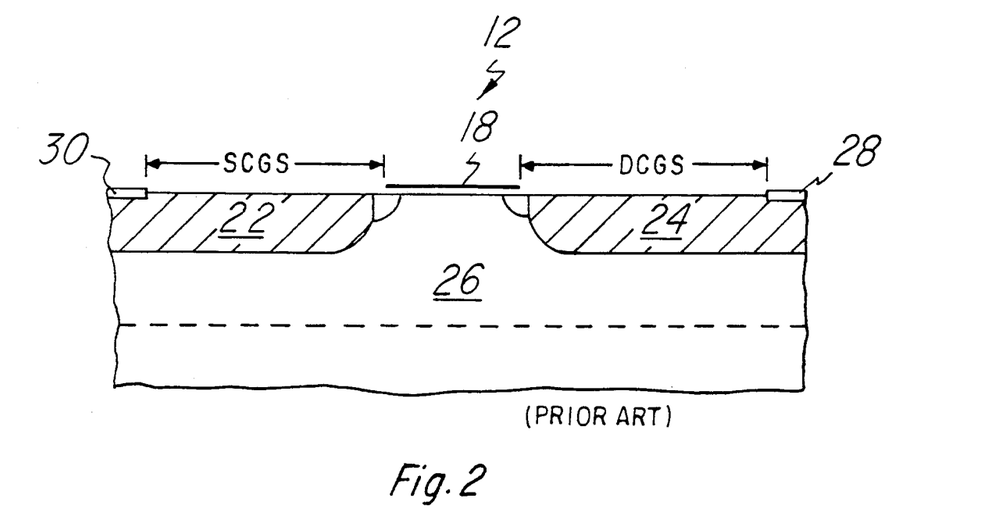
FIG. 2 is a cross-sectional view a portion of the prior art circuit of FIG. 1.

In MOS technologies, a widely used ESD/EOS protection structure for input, output, and supply pins can be schematically represented by the circuit 10 in FIG. 1. An nMOS transistor 12 is connected between the pin 14 and ground 16. The gate 18 of nMOS transistor 12 is connected to driving circuit 20. Driving circuit 20 is connected between the pin 14 and ground 16. Typically, circuit 10 is implemented in a multi-finger configuration. FIG. 2 show a cross-sectional view of a finger of prior art nMOS transistor 12. Source region 22 and drain region 24 are located in semiconductor body 26. Gate 18 is located above semiconductor body 26 between source and drain regions 22,24. Drain contact 28 and source contact 30 are located on the opposite ends of drain region 24 and source region 22, respectively, from gate 18. The source contact to gate spacing (SCGS) is equal to the drain contact to gate spacing (DCGS).

Figure 3A:
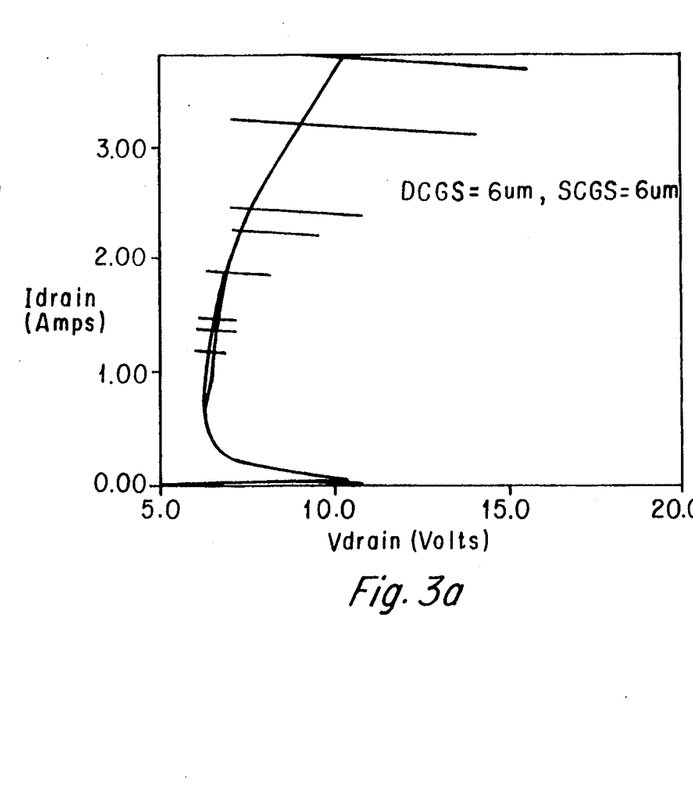
FIGS. 3a–c are graphs of I-V characteristics for various stress current levels.
Figure 3B:
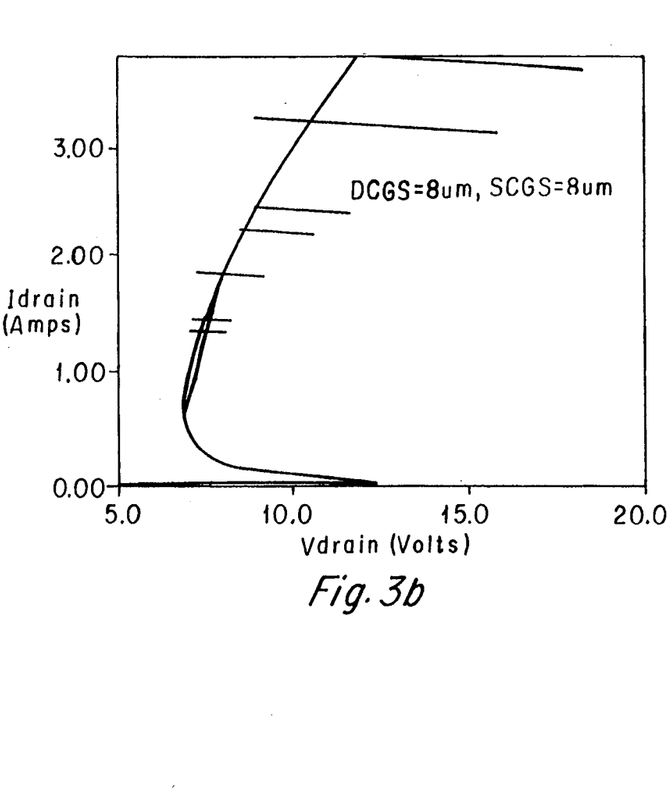
Figure 3C:
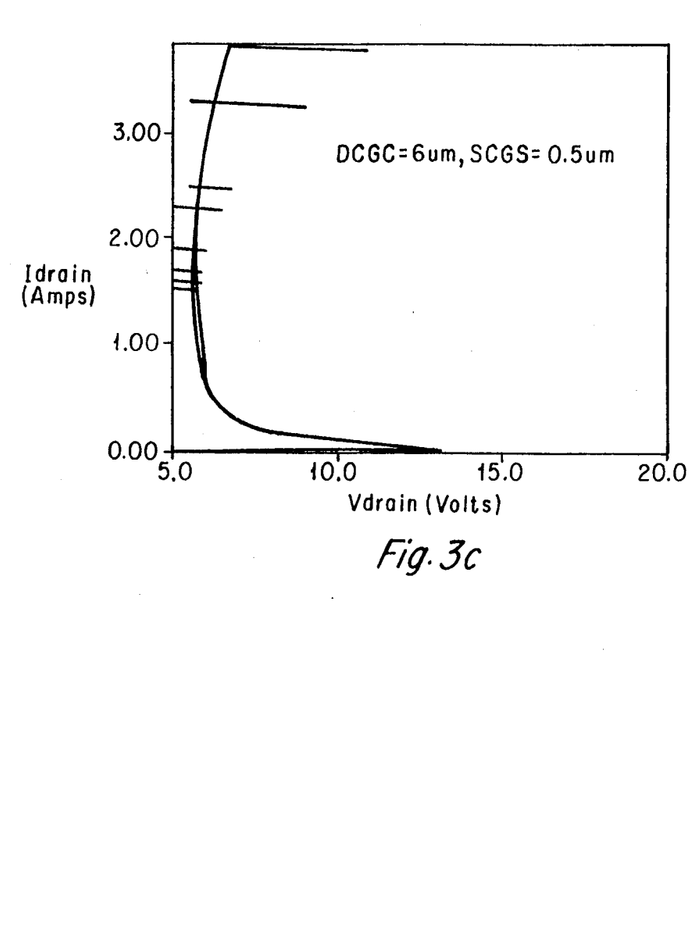

The failure time of a protection structure may be defined as the time required by the protection structure to reach either silicon melting temperature or the onset of second breakdown for a given stress level measured in terms of the peak stress current. FIGS. 3a–c show the simulated transient current-voltage (I-V) characteristics for three different cases of contact-to-gate spacing. Referring to FIGS. 3a–b, a uniform increase of the DCGS and the SCGS causes an increase of the ballasting resistance and an increase of the snapback voltage. However, referring to FIG. 3c, a substantial reduction in the snapback voltage is attained if minimum SCGS is used. If the areas of drain region 24 and source region 22 are kept equal, the reduced snapback voltage of FIG. 3c translates into reduced nMOS device self-heating for a fixed stress current level. Therefore, structures with minimum SCGS are capable of handling higher stress current levels before reaching failure.

Figure 4:
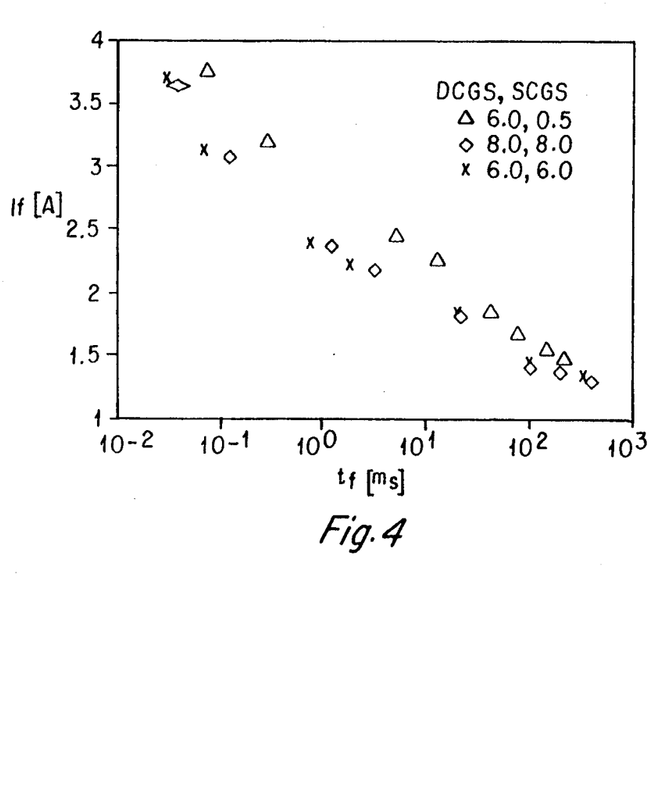
FIG. 4 is a graph of stress current level versus the time-to-failure.

FIG. 4 shows the expected behavior of the failure current versus the time to failure for the same three different conditions of the contact spacings. A marginal improvement in the failure current level can be obtained when uniformly increasing the drain and source contact-to-gate spacings. However, a substantial improvement in the failure current level (and thus the failure threshold) can be achieved if the SCGS is kept to a minimum.

Figure 5:
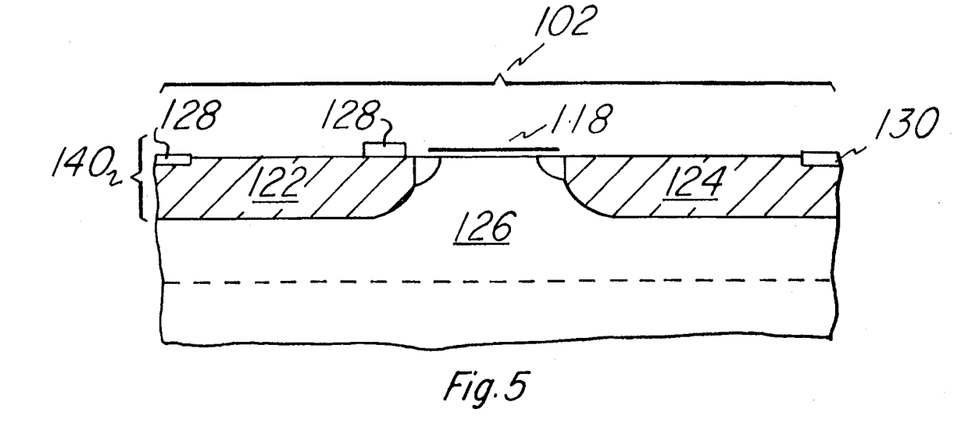
FIG. 5 is a cross-sectional view of the preferred embodiment of the invention.

A cross-sectional view of a finger 140 of nMOS transistor 102 according to the preferred embodiment of the invention is shown in FIG. 5. Source region 122 and drain region 124 are located in semiconductor body 126. Source region 122 and drain region 124 are of approximately equal size. Source contacts 128 are located such that the SCGS is minimal in order to obtain the improved ESD/EOS performance discussed above. Drain contact 130 is placed on the opposite side of drain region 124 from gate 118. The DCGS is chosen to achieve an appropriate level of drain ballasting resistance.

Figure 6:
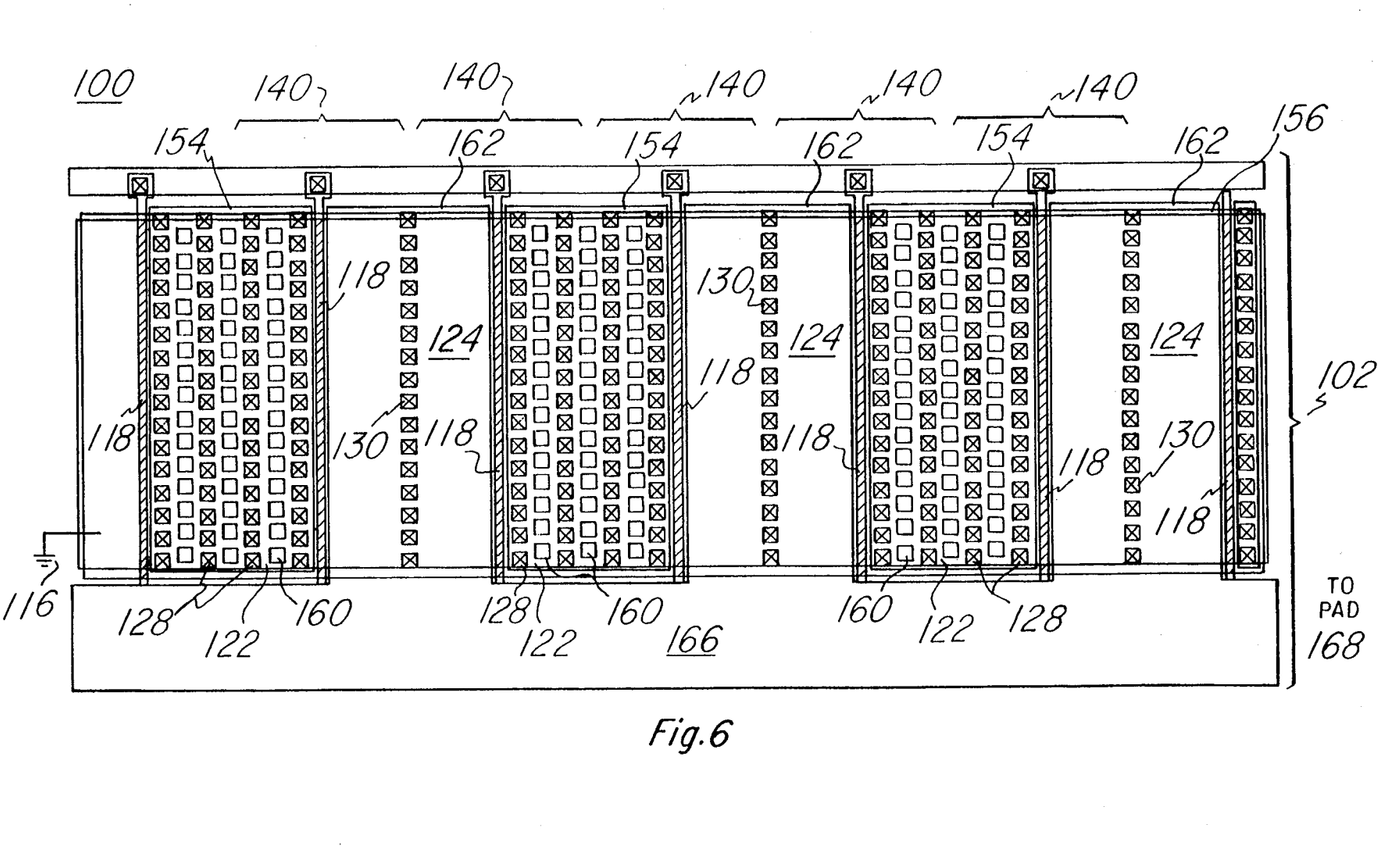
FIG. 6 is a layout diagram of the preferred embodiment of the invention.

FIG. 6 shows a preferred layout for the preferred embodiment of the invention. The improved ESD/EOS performance obtained by using minimum SCGS (as determined by the process design rules), is achieved in each device finger 140 of nMOS transistor 102 by placing a row of source contacts 128 at a minimum distance from the gate 118 edge as allowed by the particular design rules. In order to minimize the power density per unit area of the device 100 and therefore improve the device resistance to EOS/ESD, a minimum area for source region 122 is not used. Instead the source 122 and drain 124 areas may be equal, with the drain 124 area determined by the DCGS necessary to achieve an appropriate level of drain ballasting resistance.

Figure 7:
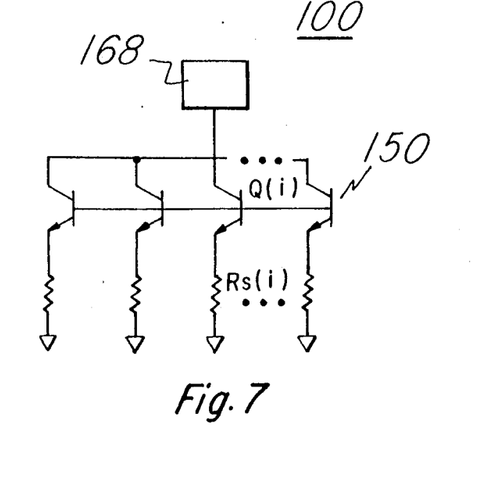
FIG. 7 is a schematic circuit model of the circuit of FIG. 6.

FIG. 7 shows a circuit schematic model for the npn parasitic bipolar transistors 150 associated with the multi-finger nMOS layout 102 of FIG. 6. In order to have uniform stress current distribution across the entire device 100, all of parasitic bipolar transistors 150 should operate with the same current level. This can be achieved if the emitter (nMOS source) parasitic interconnect resistances of all the fingers are equal. To accomplish this, a level 2 metal layer 156 interconnects all the sources 122 in the device 100 and provides a solid pad to ground 116 as shown in FIG. 6.

Referring to FIG. 6, each diffusion area (source regions 122 and drain regions 124) is delimited by two polysilicon gates 118. Source regions 122 are covered with a level 1 metal slab 154 and drain regions 124 are covered with a level 1 metal slab 162. The entire nMOS protection device 100 is covered by a level 2 metal layer 156. For each source region 122 in the multi-finger device 100, two rows of source contacts 128 (level 1 metal to source region contacts) are placed each at a minimum distance 15 from the gate 118. The minimum distance is defined as the minimum allowed by the applicable design rules. For example, in a particular 0.5 micron process, the minimum distance may be 0.5 microns. The space in between these two rows of source contacts 128 is then filled by alternating level 1 metal to level 2 metal contact rows 160 with rows of source contacts 128. The level 2 metal layer 156 interconnecting all the source regions 122 is then connected to the chip ground 116. Each one of the drain regions 124 is covered with a level 1 metal slab 162 and a single row of drain contacts 130 is placed at a distance DCGS from the neighboring gate 118 edges. All level 1 metal slabs 162 are then interconnected outside the active area by another level 1 metal strap 166 that can then be tied to the pad 168 to be protected.

Figure 8A:
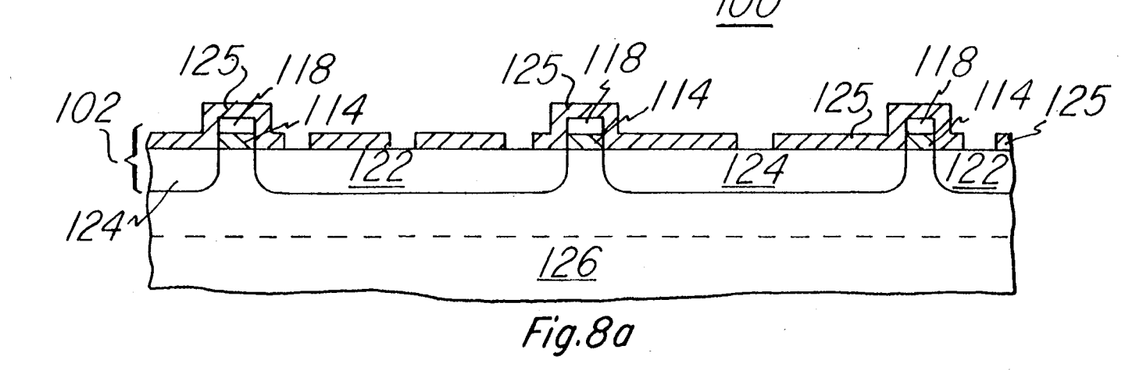
FIGS. 8a–d are cross-sectional views of the preferred embodiment of the invention at various fabrication steps.

A preferred method of forming circuit 100 will now be described with reference to FIGS. 8a–d. Referring to FIG. 8a, a plurality of gates 118 are formed over the surface of semiconductor body 126 by conventional techniques. For example, a polysilicon layer may be deposited over a thermally grown gate oxide layer 114 and etched to form gates 118. Next, a plurality of source regions 122 and a plurality of drain regions 124 may be implanted on opposite sides of gates 118 such that one of said source regions 122 is located on one side of each gate 118 and one of said drain regions 124 is located on the other side of each gate 118. Source regions 122, drain regions 124 and gates 118 comprise a multi-finger nMOS transistor 102. A layer of insulating material 125 is deposited and etched as shown in FIG. 8a.

Figure 8B:
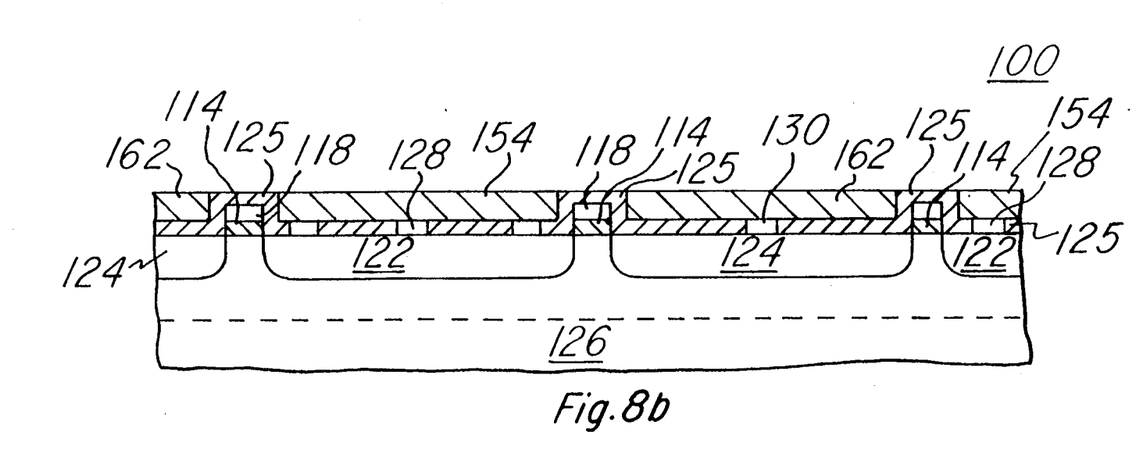

Referring to FIG. 8b, a layer of conductive material is deposited and etched to form a plurality of drain contacts 130 and source contacts 128. Drain contacts 130 are formed over each of the drain regions 124 at a distance of DCGS from the adjacent gates 118 to connect metal slab 162 to drain region 124. Source contacts 128 are formed over each source region 122 to connect metal slab 154 to source regions 122. Preferably, source contacts 128 are arranged in rows such that one row of source contacts 128 is at a minimum distance from the adjacent gate 118, as shown in FIG. 6. Next, a layer of metal 1 is deposited and etched to form metal slab 162 over drain regions 124 and metal slab 154 over source regions 122.

Figure 8C:
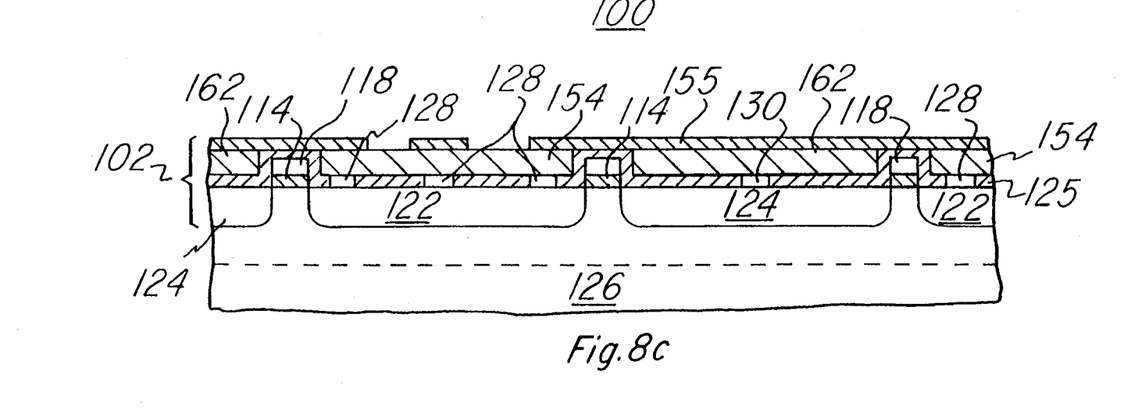
Figure 8D:
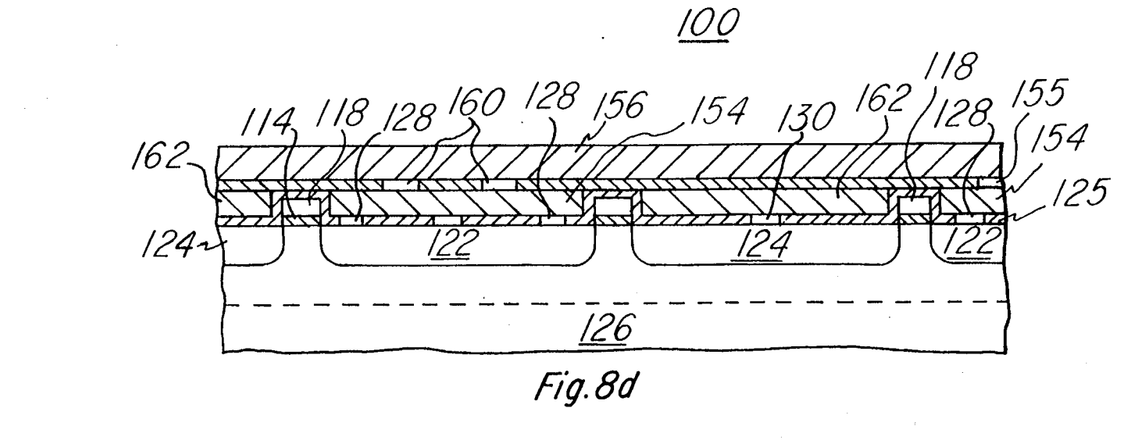

Referring to FIG. 8c, an insulator layer 155 is deposited over the surface and etched. A conductive layer is deposited and etched to form a plurality of level 1 metal to level 2 metal contact rows 160 over source regions 122, as shown in FIG. 8d. Finally, a layer of level 2 metal 156 is deposited over insulator layer 155 and level 1 metal to level 2 metal contact rows 160.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An ESD/EOS protection circuit for protecting an integrated circuit comprising:
   a. a MOS transistor having a drain region, a source region and a gate;
   b. at least one source contact located above said source region at a first distance from said gate, wherein said at least one source contact comprises a plurality of source contacts arranged into a plurality of rows and columns;
   c. at least one drain contact located above said drain region at a second distance from said gate, wherein said first distance is smaller than said second distance.

2. The ESD/EOS protection circuit of claim 1, wherein said source region and said drain region comprise approximately the same amount of area.

3. The ESD/EOS protection circuit of claim 1, wherein said first distance is less than 2 microns.

4. The ESD/EOS protection circuit of claim 1, wherein said first distance is a lithographic minimum distance.

5. The ESD/EOS protection circuit of claim 1, wherein said at least one drain contact comprises a plurality of drain contacts arranged in a row.

6. The ESD/EOS protection circuit of claim 1, further comprising:
   a. a first metal layer extending over said drain region and in contact with said drain region via said at least one drain contact;
   b. a second metal layer extending over said source region and in contact with said source region via said at least one source contact;
   c. a third metal layer extending over said MOS transistor; and
   d. a plurality of metal-to-metal contacts for connecting said third metal layer with said second metal layer.

7. An ESD/EOS protection circuit for protecting an integrated circuit comprising:
   a. a MOS transistor arranged in a multi-finger configuration having a plurality of drain regions, a plurality of source regions and a plurality of gates, wherein each of said gates is located between one of said source regions and one of said drain regions;
   b. a plurality of source contacts located above each of said source regions at a first distance from at least one of said plurality of gates;
   c. a plurality of drain contacts located above each of said drain regions at a second distance from at least one of said plurality of gates, wherein said first distance is smaller than said second distance;
   d. a first metal layer extending over and substantially covering each of said drain regions and in contact with each of said drain regions via said plurality of drain contacts;
   e. a second metal layer extending over and substantially covering each of said source regions and in contact with each of said source regions via said plurality of source contacts;
   f. a third metal layer extending over and substantially covering said MOS transistor; and
   g. a plurality of metal-to-metal contacts for connecting said third metal layer with said second metal layer over each of said source regions.

8. The ESD/EOS protection circuit of claim 7, wherein said plurality of source regions and said plurality of drain regions comprise approximately the same amount of area.

9. The ESD/EOS protection circuit of claim 7, wherein said first distance is less than 2 microns.

10. The ESD/EOS protection circuit of claim 7, wherein said first distance is a design minimum.

11. The ESD/EOS protection circuit of claim 7, wherein said plurality of drain contacts are arranged in a row above each of said drain regions.

12. The ESD/EOS protection circuit of claim 7, wherein said third metal layer is connected to a ground and said first metal layer is connected to a protected pad.

13. The ESD/EOS protection circuit of claim 7, wherein said plurality of source contacts and said plurality of metal-to-metal contacts are arranged in a plurality of alternating rows over each of said source regions.

* * * * *